United States Patent [19]

Friend

[11] 3,978,404

[45] Aug. 31, 1976

[54] INDICATING OR MEASURING INSTRUMENTS

[75] Inventor: Terence Friend, Dover, England

[73] Assignee: Taylor Electrical Instruments Limited, England

[22] Filed: Apr. 1, 1975

[21] Appl. No.: 564,112

Related U.S. Application Data

[62] Division of Ser. No. 443,323, Feb. 19, 1974, Pat. No. 3,895,291.

[52] U.S. Cl. ............................................. 324/115
[51] Int. Cl.² ....................................... G01R 15/08
[58] Field of Search ........................... 324/115, 131

[56] References Cited
UNITED STATES PATENTS

| | | | |
|---|---|---|---|
| 408,157 | 7/1889 | Barrett | 324/115 |
| 2,466,558 | 4/1949 | Sadlon | 324/115 |
| 3,544,896 | 12/1970 | Solow | 324/115 |

Primary Examiner—R. V. Rolinec
Assistant Examiner—Ernest F. Karlsen
Attorney, Agent, or Firm—Lawrence E. Laubscher

[57] ABSTRACT

A multi-range electrical measuring or indicating instrument including a current sensitive movement adapted to provide an indication of an electrical signal. The movement is connected to contacts which make electrical connection with contact members on a printed circuit member. The printed circuit member includes circuit apparatus for controlling the sensitivity of the instrument, and is movable relative to the contacts to selectively connect the circuit apparatus to the movement.

3 Claims, 6 Drawing Figures

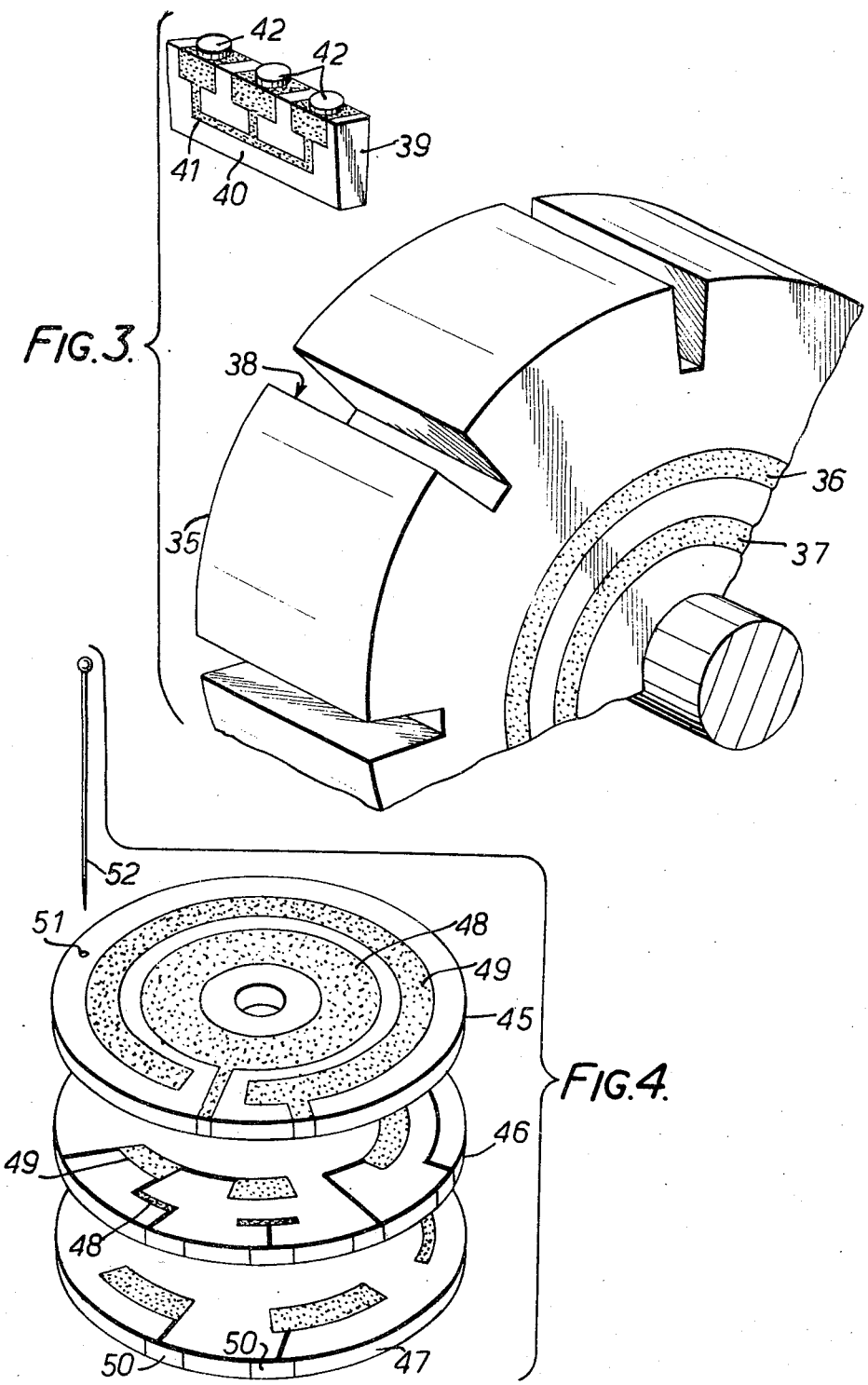

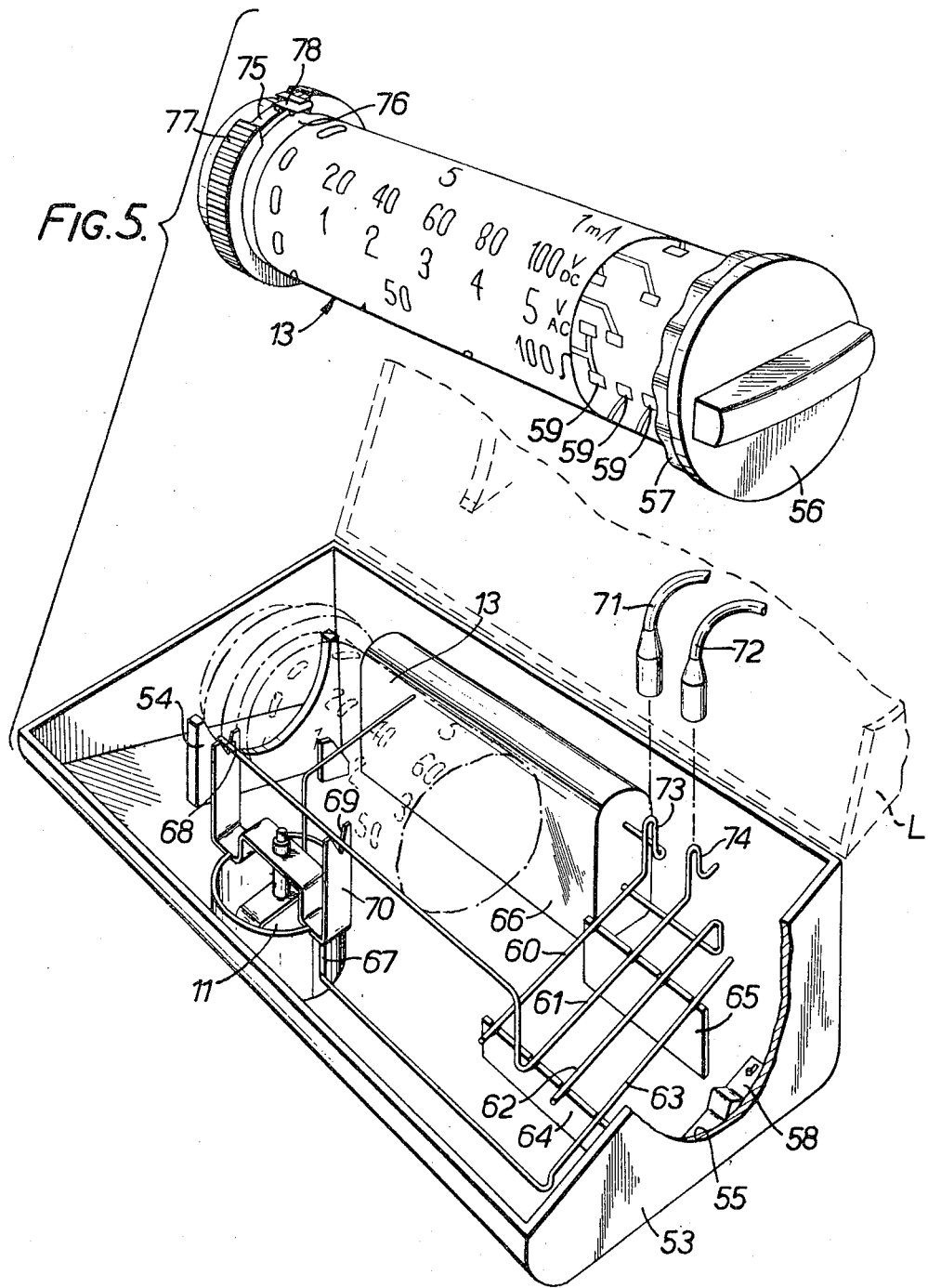

INDICATING OR MEASURING INSTRUMENTS

COPENDING APPLICATIONS

The present application has been divided from United States Patent application Ser. No. 443,323 filed on Feb. 19, 1974 and entitled "Indicating or Measuring Instruments" now U.S. Pat. No. 3,895,291.

FIELD OF THE INVENTION

This invention relates to indicating or measuring instruments, particularly but not exclusively of the multi-range electrical type. The invention can be applied to such instruments with range selection by switching, with or without scale selection.

BACKGROUND TO INVENTION

Multi-range measuring instruments usually require electrical switches for selecting the necessary shunts, series elements or other circuit variations, in addition to the provision of the circuit elements themselves. The present invention relates to instruments of this kind.

THE PRIOR ART

In the past, switches for multi-range instruments of this kind have generally been of the conventional type, with a moving member and a stationary member, with manual control means. In an endeavour to facilitate manufacture, some multi-range instruments have made use of printed circuit elements as the switched elements of the meter, such as series resistors for multi-range voltmeters, or shunts for multi-range current meters.

SUMMARY OF INVENTION

The invention concerns multi-range instruments and has for its object to provide a multi-range instrument in the advantages of printed circuit manufactures are obtained and at the same time the complexity of a conventional multiway switch is obviated.

The invention also has for its object to provide a multi-range instrument which has a composite moving member on which circuit elements are provided by a printed circuit technique, the moving member providing also, with stationary contact making means, the multiway switch, and which further provides interchangeable scale means, pertaining to each selected instrument range.

BRIEF DESCRIPTION OF THE DRAWINGS

Features and objects of the invention will also appear from the following description of embodiments thereof, given by way of example, in conjunction with the accompanying drawings, in which:

FIG. 3 is a fragmentary diagrammatic exploded perspective view of a modified form of switch barrel and contact;

FIG. 4 is a diagrammatic exploded perspective view of an alternative switch construction;

FIG. 5 is a diagrammatic exploded perspective view of a multi-range instrument.

DETAILED DESCRIPTION OF THE INVENTION

Figure 1:
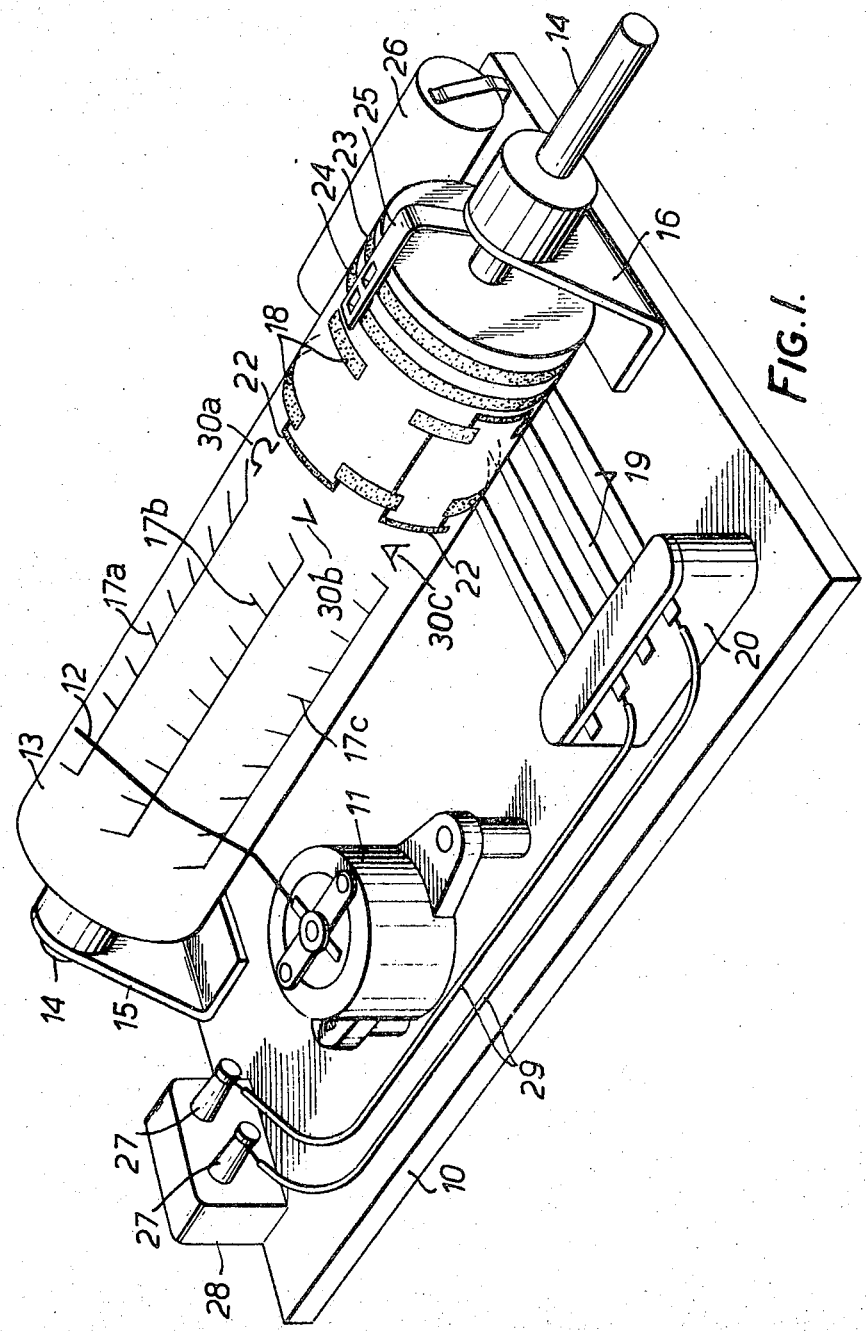
FIG. 1 is a diagrammatic perspective view of a multi-range electrical measuring instrument, with switched range and scale selection, with the cover removed.

The embodiment of the invention shown in FIG. 1 is an electrical multi-range measuring instrument which has ranges of voltage, current and resistance measurement, but it will be understood that other measurement or other combinations of measurements can be adopted.

The instrument comprises a base 10, conveniently of moulded insulating material, on which is supported the motor, transducer or movement, which in this example is shown as a movement 11, of moving coil or other convenient type. The movement operates a pointer 12.

A multi-range instrument of the type referred to requires for its operation voltage dropping resistors for voltage ranges, shunt resistors for current ranges, a voltage source, resistors and a variable resistor for resistance ranges and selecting switch means. Separate scales are also required.

A rotatable cylinder structure is provided which gives scale selection, switch and variable resistor operation, and support for some or all of the resistors. This structure includes a cylinder 13 of insulating material, conveniently ceramic, which is mounted on a shaft 14 carried in bearing brackets 15, 16 secured to or forming part of the base 10. The pointer 11 is positioned so as to move over part of the surface of the cylinder, and at this part the cylinder bears scales such as 17a, 17b and 17c. By rotating the cylinder, a desired scale can be brought into the uppermost position. The scales can be printed directly on the cylinder, or on a sheet of material fixed to it.

The cylinder structure also carries contact members, co-operating with stationary contact fingers, to give switching operations as the cylinder is rotated.

A pattern of electrical contacts 18 is arranged about the periphery of the cylinder near one end; the contacts are disposed to co-operate with spring fingers 19 mounted in an insulating support 20 carried on the base 10. The contacts 18 are advantageously formed directly on the insulating cylinder 13 and if this is of a ceramic material, as is preferred, the contacts can be formed by a so-called "thick film" method or by plating.

The cylinder also supports various resistors; such resistors may be discrete components but can also be formed directly on the cylinder, as at 22, and connected directly to the appropriate contacts 18. Connections between contacts 18 can also be formed directly on the surface of the cylinder, by the same method.

The variable resistor required for resistance measurement is provided by two further tracks 23, 24 on the surface of the cylinder and a spring wiping contact member 25 rotatably mounted on shaft 14. The contact member 25 can bridge the two tracks, one of which is resistive and the other resistive or conductive, as may be convenient. One or more cells required for resistance measurement are mounted on the base at 26, in a suitable holder. Input terminals 27 for the meter are mounted in an insulating block 28 on the base, and wire or strip connections 29, or printed circuit connections, used to complete the circuit of the meter. The meter is completed by a suitable cover, not shown, having a window through which the selected scale, and range indentification, as at 17a, can be seen, and control knobs for shaft 14 and for wiping contact 25. The control knob for shaft 14 can have range indications, or such indications can be provided on the cylinder, as at 30a, 30b or 30c adjacent the appropriate scale.

Figure 2:
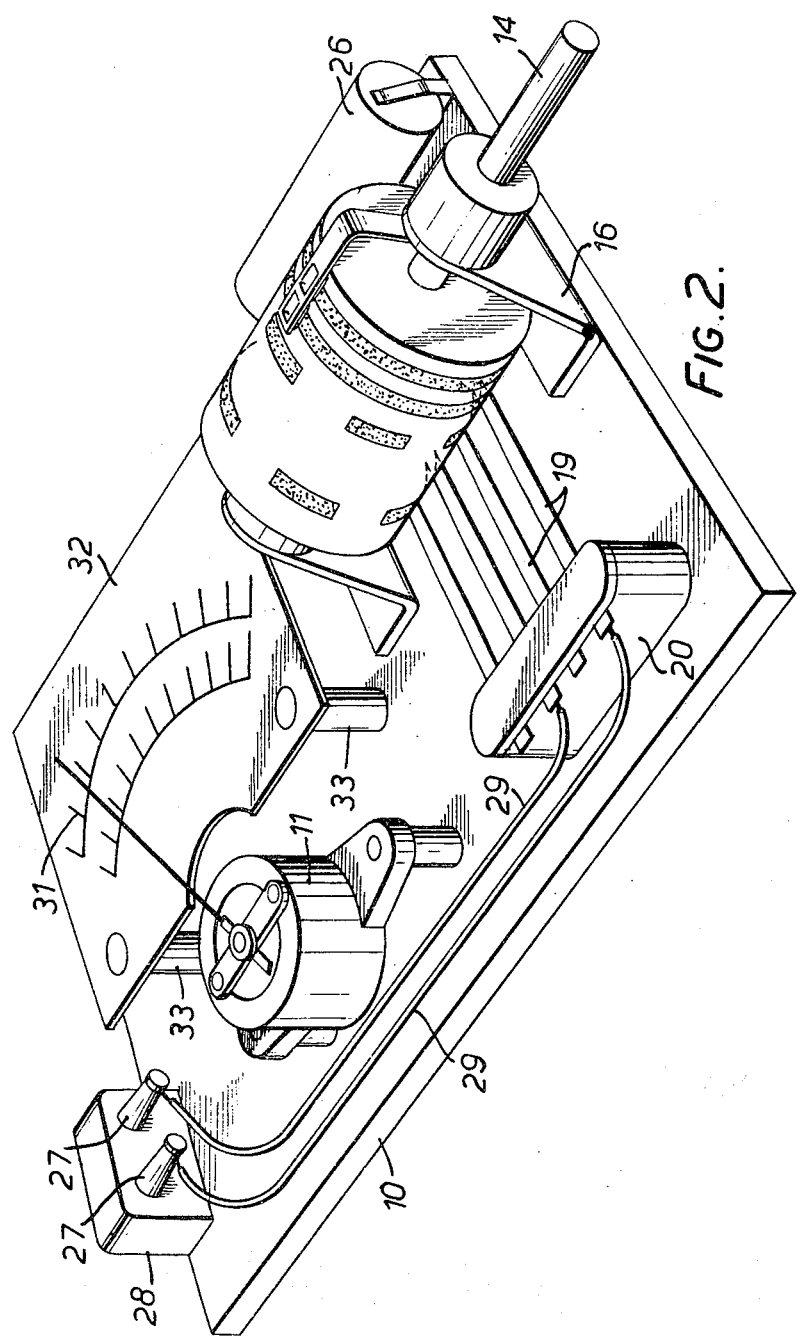
FIG. 2 is a diagrammatic perspective view of a multi-range electrical measuring instrument, with switched range selection, with the cover removed.

FIG. 2 is a modification of the arrangement of FIG. 1, in which the cylinder is shorter and carries the switching means resistors and resistance tracks as in FIG. 1, but the range scales 31 are printed on a flat scale panel 32 supported from base 10 by pillars or projections 33.

FIG. 3 shows an alternative form of cylinder and switch contacts. The cylinder 35 can be of moulded or pressed form, and carries tracks 36, 37, at least one of which is resistive, on its end face. As in the manner of tracks 23, 24, tracks 36, 37, are engaged by a wiping contact, not shown in FIG. 3, mounted on the shaft of the cylinder. The cylinder has slots 38 to receive contact inserts 39 each formed as a thick film member comprising a substrate 40 with deposited conductors 41 leading to headed edge contacts 42. The inserts are held in the slots by adhesive or by a suitable mechanical fixing means. The desired relative movement of the drum and the contacts can be effected by moving the drum, or the contacts, or both.

The switch member can also be made as a series of discs, in the manner indicated in FIG. 4. Three such discs, of which any suitable number can be used, are shown at 45, 46 and 47. The discs can be of ceramic or other insulating material, which serve as substrates for thick film contacts and resistance deposits at 48 or 49, in the manner previously described, with conductors extending to edge contacts 50. The co-operating contacts can be spring fingers, as in FIGS. 1 and 2 or a printed circuit or similar element as shown in FIG. 3. The discs can be located angularly by holes, such as 51, and a locating pin 52 passing through the holes. The discs are mounted on a suitable shaft and the construction of the instrument is suitably completed, for example, as in the embodiments described above.

FIG. 5 shows a practical embodiment of a measuring instrument capable of measuring a.c. and d.c. voltages, and electrical resistance, the instrument being of a similar construction to that described with reference to FIG. 1.

The movement 11, cylinder 13 and a battery are included in a moulded, insulating housing which comprises an electrically insulating base 53 and a lid L. The lid includes a window for displaying, one at a time, the scales printed on the cylinder.

The cylinder is rotatably mounted and is supported at one end by an extension 54 formed in the base and a similar extension in the lid. The other end of the cylinder extends through a hole 55 in the housing and is fitted with a knob member 56 enabling the cylinder to be rotated. The knob member has a knurled ring 57 which co-operates with a metal leaf spring 58 on the base to locate the cylinder in a plurality of positions of rotation such that different scales may be displayed at the window.

Electrical circuits are formed in the surface of the cylinder by means of thick film techniques and are each connected to contact members 59 formed at one end of the cylinder. The members 59 are arranged in four parallel, coaxial rings which engage respective ones of four parallel portions of metallic wires 60, 61, 62 and 63 supported in grooved extensions 64 and 65 of the base. Wires 60 and 62 are connected to the battery which is located in an enclosure 66 in the base, and wires 61 and 63 are connected to the movement 11.

The movement 11, in this embodiment, is of the moving coil type and is held in an upstanding cylindrical extension moulded in the base 53. Wire 63 engages, and is thereby connected to, the lower side of the movement through a slot 67 in the cylinder, and the wire 61 is connected to the upper side of the movement by engagement with V-shaped slots 68 and 69 in a metallic member 70 connected to the movement. The wires 61 and 63 are held in position by extensions on the lid which press the wire 61 and the cylinder 13 towards the base 53.

Probes 71 and 72 are connected to the wires 60 and 61, the wires being formed with inverted U-shaped portions 73 and 74 such that sockets on the probes may be inserted through holes in the lid to engage the portions 73 and 74.

The cylinder 13 is formed with a variable resistor comprising parallel bands 75 and 76 of conducting and resistive material, and a rotatable ring 77 of insulating and preferably plastics material which includes a conducting member 78 that bridges the bands. The ring protrudes from a slot in the lid of the housing and rotation of the ring 77 provides a control of the zero setting for measurement of electrical resistance.

Figure 6:
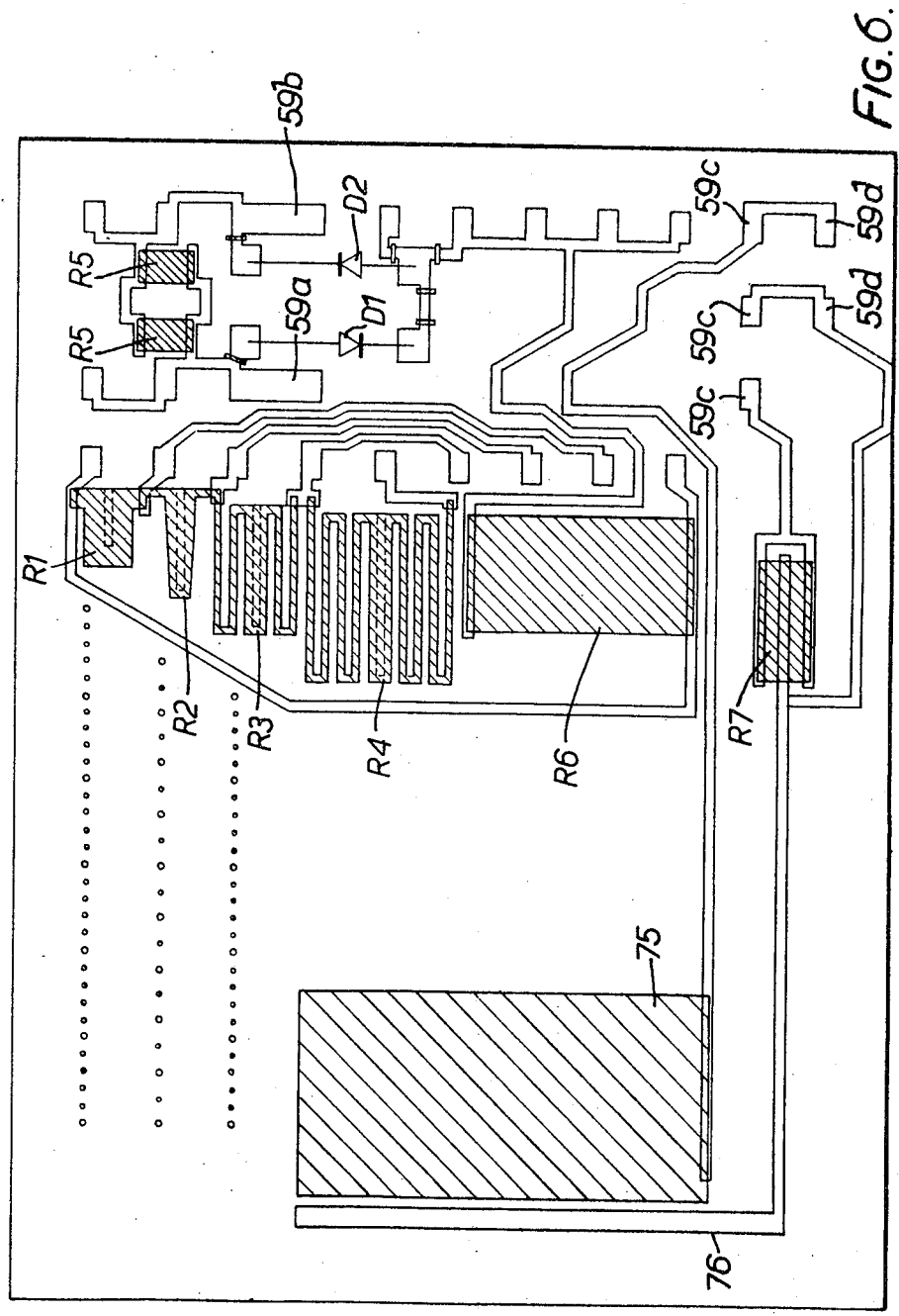
FIG. 6 is a circuit diagram of the instrument of FIG. 5.

FIG. 6 shows an example of the circuits included in the surface of the cylinder 13 shown in FIG. 5. The circuits include a chain of resistances R1 – R4 and R6 which are selectively connected in series with the movement 11 via the terminals 59. To permit measurement of a.c. voltages, a pair of diodes D1 and D2, and resistors R5 are connected to terminals 59a and 59b such that when connected to the wires 61 and 63, a half wave rectified voltage is applied to the movement 11 from the probes 71 and 72.

Two ranges of resistance measurement are provided, through terminals 59c and 59d, resistance R7 making the circuit via terminals 59d the most sensitive. The resistance band 75 and conductive strip 76 cooperate with ring 77 to provide a zero set control for resistance measurement.

Voltage and resistance scales for a selected range are printed or painted on the surface of the cylinder 13 parallel to its axis and diametrically opposite the terminals 59 corresponding to the selected range. Thus when a set of contacts is in connection with the movement 11, the appropriate range is displayed at the window in the lid.

The instruments described can be made more easily than a conventionally assembled instrument, and perform reliably over a period of time.

I claim:

1. A multi-range electrical instrument, comprising:
   a. a generally hollow base (53) including aligned supporting recesses (54, 55) at opposite ends thereof;
   b. an electrical measuring instrument (11) mounted upon said base;
   c. a cylindrical ceramic support body (13) rotatably mounted in said supporting recesses for movement between a plurality of different range-establishing positions;
   d. printed circuit means mounted adjacent the cylindrical surface of the said support body, said printed circuit means including a plurality of electrical impedance elements having different impedance values, respectively;
   e. means responsive to the position of rotation of said support body relative to said base for selectively connecting said printed circuit elements with said measuring instrument to establish different operating ranges thereof, respectively, said connecting means including:

1. stationary contact means mounted on said base between said recesses and electrically connected with said measuring instrument, said stationary contact means including a plurality of electrically conductive elongate members (61–63) mounted on said base; and
2. a plurality of movable contact means (59) mounted adjacent of said cylindrical ceramic support body and electrically connected with different ones of said impedance elements, respectively, said movable contact means being disposed on said cylindrical support body for selective electrical connection with the stationary contact means upon rotation of said body relative to said base;

f. means for connecting some of said stationary contact means (60, 62) with a voltage source;
g. means (56) for rotating said support body between different ones of said range-establishing positions;
h. lid means (L) enclosing said hollow base and containing a window; and
i. a plurality of different scales mounted on said cylindrical support body in overlying relation to said printed circuit means, the scales corresponding with respective ones of said range-establishing positions and having such a disposition relative to said contact means as to be displayed at said window upon establishment of respective one of said operating ranges by rotation of said cylindrical support body.

2. Apparatus as defined in claim 1, wherein said lid means includes supporting recesses which cooperate with the supporting recesses on said base for rotatably supporting said cylindrical support body, whereby said recessed portions on said lid means urge the cylindrical support into engagement with said stationary contacts for the establishment of reliable electrical contact between said stationary and movable contact means, respectively.

3. Apparatus as defined in claim 1, and further including detent means (57,58) for locating said cylindrical support body in the various range-establishing positions relative to said base.

* * * * *